United States Patent [19]

Sarace

[11] 4,416,050

[45] Nov. 22, 1983

[54] METHOD OF FABRICATION OF DIELECTRICALLY ISOLATED CMOS DEVICES

[75] Inventor: John C. Sarace, Temecula, Calif.

[73] Assignee: Rockwell International Corporation, El Segundo, Calif.

[21] Appl. No.: 305,247

[22] Filed: Sep. 24, 1981

[51] Int. Cl.³ .................................... H01L 21/265
[52] U.S. Cl. ............................ 29/571; 29/577 C; 29/576 E; 29/576 W; 148/187; 148/175
[58] Field of Search ............... 148/187, 175; 29/571, 29/577 C, 576 E, 576 W

[56] References Cited

U.S. PATENT DOCUMENTS

| | | | |
|---|---|---|---|
| 3,966,577 | 6/1976 | Hochberg | 29/580 X |
| 3,983,620 | 10/1976 | Spadea | 29/578 X |
| 4,088,516 | 5/1978 | Kondo et al. | 148/175 X |
| 4,183,134 | 1/1980 | Oehler et al. | 148/187 X |
| 4,203,126 | 5/1980 | Yim et al. | 357/89 X |
| 4,263,057 | 4/1981 | Ipri | 148/187 X |
| 4,277,883 | 7/1981 | Kaplan | 148/187 X |

Primary Examiner—G. Ozaki
Attorney, Agent, or Firm—H. Fredrick Hamann; Daniel R. McGlynn

[57] ABSTRACT

A method of fabricating an integrated circuit on a body of semiconductor material of a first conductivity type and a first dopant concentration by depositing a layer of semiconductor material of first conductivity type and a second dopant concentration on the body; etching the layer to form distinct silicon islands; depositing dopant species in predetermined ones of the silicon islands so that the major surface and exposed edges of ones of the islands becomes second conductivity type; and thermally oxidizing the exposed surface portions of the body so that oxide fills the regions between the silicon islands.

6 Claims, 9 Drawing Figures 4,416,050

METHOD OF FABRICATION OF DIELECTRICALLY ISOLATED CMOS DEVICES

BACKGROUND OF THE INVENTION

1. Field of the Invention

The invention relates to the fabrication of semiconductor devices, and in particular to a method of fabrication of dielectrically isolated CMOS devices.

2. Description of the Prior Art

Complementary MOS (CMOS) integrated circuits, and their method of fabrication, are well known in the art of semiconductor device technology. One type of CMOS device is implemented on bulk silicon. Complementary MOS integrated circuit on bulk silicon require that the N and P channel devices be electrically isolated from each other. The prior art technique for accomplishing this electrical isolation by junction isolation of either device.

There are significant disadvantages to the junction isolation technique of the prior art. The isolation junction creates parasitic bipolar transistors which in combination form silicon controlled rectifiers (SCR). These devices trigger to the "on" state condition when noise pulses, ionizing radiation, or adverse thermal conditions upset the normal voltage bias operating range for normal IC operation. Once triggered, the circuit "latches up" and recovery can only be obtained by removing power to the device. Prior to the present invention, there has been no effective technique to prevent the latch up condition in CMOS bulk devices when the devices are placed in close proximity.

RCA Technical Note 876, dated Feb. 12, 1971, published by RCA Corporation, Princeton, N.J., apparently describes the use of an N-epitaxial layer on a N+ substrate, in conjunction with guard rings to eliminate parasitic SCR transistors and latching.

U.S. Pat. No. 4,203,126 (Yim et al) approaches the latching problem by a buried layer along with an epitaxial N− layer on an N substrate and guard rings, to affect circuit parameters thus to reduce the gain of the parasitic components.

Dielectric insulated regions are used about MOS devices for isolation in U.S. Pat. No. 4,053,926 (Burr et al).

The combination of an N epitaxial layer on an N+ layer with silicon dioxide thermally grown or deposited in grooves for isolation of integrated circuits is disclosed in U.S. Pat. No. 3,966,577 (Hochberg).

SUMMARY OF THE INVENTION

The invention consists of a method for fabricating a dielectrically isolated CMOS device including the steps of depositing an epitaxial silicon layer of N type on an N+ type substrate; etching V-grooves through the N type epitaxial silicon layer to form a plurality of silicon islands; selectively implanting edges of the silicon islands; oxidizing to electrically isolate the islands; and implanting P+ and N+ in selective regions of the islands.

More particularly, the invention consists of a method of fabricating an integrated circuit on a body of semiconductor material of a first conductivity type and a first dopant concentration comprising the steps of depositing a layer of semiconductor material of the first conductivity type of a second dopant concentration on the body; defining an oxide inhibiting masking pattern on a major surface of the layer of semiconductor material where distinct silicon islands are to be formed; etching openings in the layer at regions defined by said pattern, the openings extending through said layer to said body; depositing dopant species in predetermined ones of the silicon islands so that the major surface and exposed edges of the ones of the islands becomes second conductivity type; thermally oxidizing the exposed surface portions of the body of semiconductor material so that oxide fills the openings; removing the oxide inhibiting masking pattern; thermally oxidizing the exposed portions of the body of semiconductor material to form a thin oxide layer over the major surface of the silicon islands; selectively providing first and second dopant species through the thin oxide layer for forming active regions of transistor devices; and selectively removing portions of the thin oxide layer to form contact areas to said active regions.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

DESCRIPTION OF THE PREFERRED EMBODIMENTS

The present invention is concerned with a method of fabricating CMOS on bulk silicon integrated circuits which minimizes the "latch up" effect with no compromise in device density.

Figure 1:
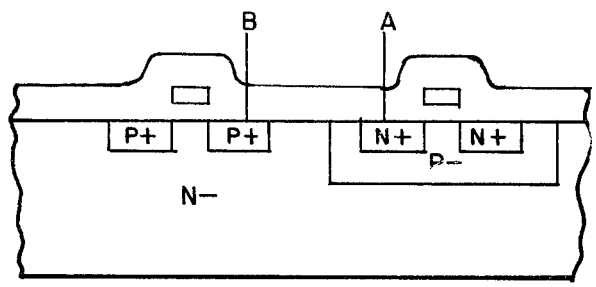
FIG. 1 is a highly simplified cross-sectional view of a CMOS bulk device as is known in the prior art.
Figure 2A:
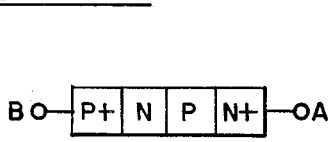
FIG. 2a is a highly simplified block schematic diagram of a lateral parasitic bipolar transistor associated with the CMOS bulk device of FIG. 1.
Figure 2B:
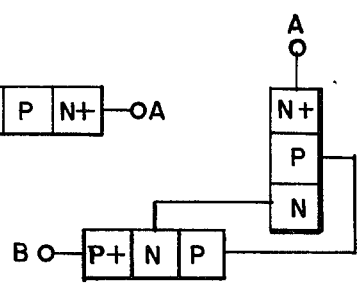
FIG. 2b is a highly simplified block schematic diagram of a vertical and horizontal parasitic bipolar device associated with the structure of FIG. 1.
Figure 2C:
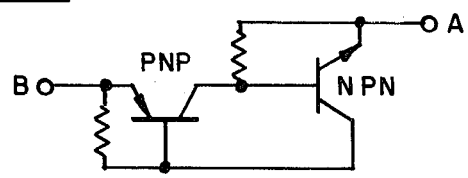
FIG. 2c is a schematic diagram of the parasitic bipolar transistors shown in block schematic form in FIG. 2b.

The "latch up" effect in CMOS bulk silicon has been described in several recent papers and publications. ("Latch Up in CMOS Integrated Circuits," B. L. Gregory et al, IEEE Trans. Nuclear Science, Vol. NS- 20, pp. 293-299, 1973. J. F. Leary & R. A. Poll, "Radiation-Induced Integrated Circuit Latch Up," IEEE Trans. Nuc. Scie., Vol. NS 16, p. 96, Dec. 1969.) This phenomena is apparently a consequence of the method in which the devices are fabricated. FIG. 1 illustrates a cross-sectional view of a typical CMOS device structure. Note that two bipolar transistors are also present: an N+ P N and a P+ N P, transistors. The two transistors are interconnected by base and collector to form an SCR structure, as suggested in FIG. 2a. FIG. 2b is a highly simplified block schematic diagram of a vertical and horizontal parasitic bipolar device associated with the structure of FIG. 1. FIG. 2c is a schematic diagram of the parasitic bipolar transistors shown in block schematic form in FIG. 2b.

The doping concentrations in the various regions are in the proper ranges for effective SCR action. Consequently, if the proper biasing conditions exist the device will trigger into the negative resistance region and is only recoverable by powering down. Previous attempts to reduce the SCR effect have centered on reducing life-time in the base region of the bipolars, increasing distance (device separation) to increase trigger voltage levels, guard ring structures, and add additional contacts to wells and substrate in order to stabilize the potential in critical regions. These remedies have enhanced the immunity of CMOS bulk to latch up but have not cured it. In addition, the device separation and guard rings solution results in a less than optimum packing density. Future IC devices (1 micron dimensions) will further magnify the separation requirement necessary to retard latch up effects.

The present invention circumvents the SCR structure by the use of dielectric isolation in combination with a degenerate substrate. Consider the device structure shown in FIG. 3. Notice the parasitic SCR structure is blocked by (a) the N+ substrate and (b) the oxide isolation. The N+ substrate serves as a high recombination medium thereby preventing carriers from reaching the collector. The oxide isolation forces the carriers to the N+ substrate. No SCR action is possible, hence, no latch up.

Figure 3:
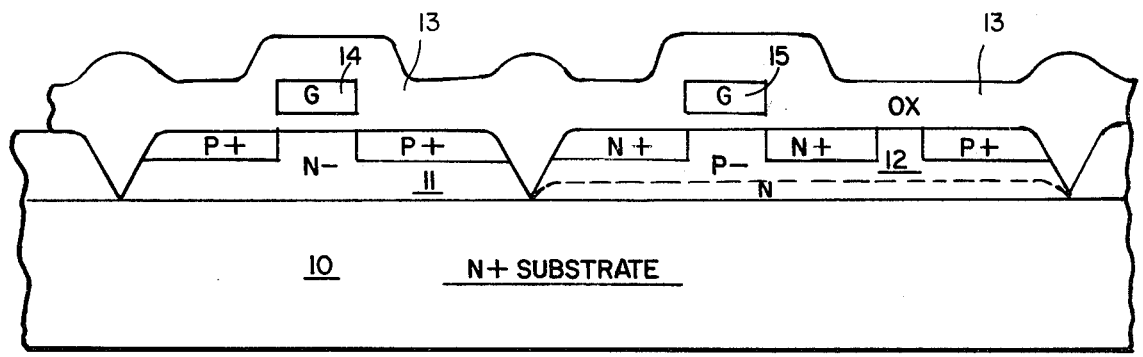
FIG. 3 is a cross-sectional view of the device structure of a dielectrically isolated CMOS on bulk silicon device according to the present invention.

Turning more specifically to the features of FIG. 3, the Figure shows a substrate 10, preferably composed of N+ conductivity type silicon and 2 silicon islands 11 and 12 disposed on the major surface of the substrate 10. The first island 11 is of N-conductivity type, while the second island 12 is of P− conductivity type. The two islands are electrically and physically separated from one another by a layer of dielectric material 13 which covers both the upper surface and the side surface of the silicon islands 11 and 12. In the preferred embodiment the dielectric 13 is silicon oxide.

The Figure also shows two P+ active regions in the silicon island 11 with a gate element G 14 disposed over the channel extending between the two P+ active elements. The silicon island 12 includes two N+ active regions with a gate 15 disposed over the channel between the two N+ regions. The silicon island 12 also includes a P+ surface region which is used to make electrical contact with the P− region in the silicon body 12.

Figure 4A:
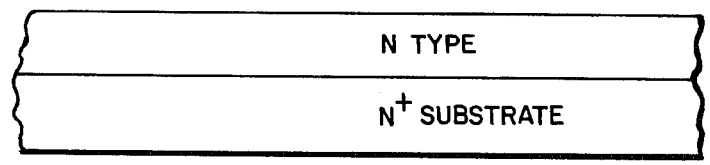
FIG. 4a is a cross-sectional view of the epitaxial silicon layer deposited on a substrate as the first step in the fabrication of the device according to the present invention.

Turning now to FIGS. 4a through 4d, there is shown a sequence of steps for fabricating the CMOS on bulk structure according to the present invention. Turning to FIG. 4a in particular, the fabrication of the structure according to the present invention begins with an N+ substrate which is preferably arsenic doped. Onto the substrate a thin epitaxial film of silicon which is lightly doped N type is deposited. The film thickness is of the order of 0.8 to 0.5 microns.

Figure 4B:
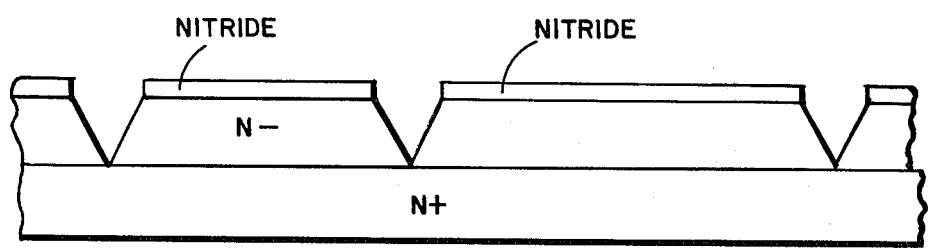
FIG. 4b shows the second step in the fabrication of the device according to the present invention consisting of a nitride masking and etching.

Turning now to FIG. 4b, in order to isolate the discrete devices, a thin film of silicon nitride is deposited, and masked appropriately. After masking, the nitride is etched, followed by another etch through the epitaxial film almost to, but not through the substrate.

Figure 4C:
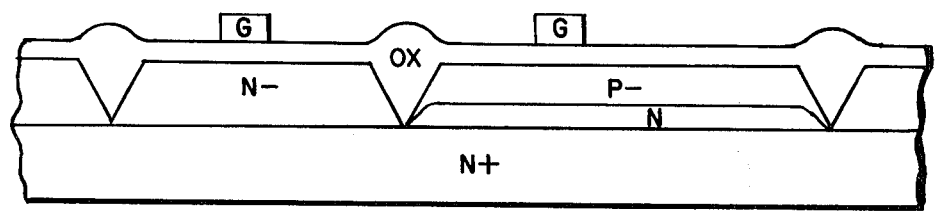
FIG. 4c shows the third step in the fabrication of the device according to the present invention including oxidizing the surface, stripping the nitride, growing gate oxide, and depositing and patterning gate electrodes.

Turning next to FIG. 4c, one then proceeds to oxidize the wafer to form the isolated regions in the epitaxial area. Typically the oxidation can be performed in a steam environment at 1,000° C. The oxide thickness should be in the order of 10,000 Angstroms. It is recognized in the prior art, such as from Kondo et al (U.S. Pat. No. 4,088,516) that oxidation will precede from below the V-shaped cuts and that the N+ silicon will be consumed as oxide is formed. The representation in the drawings is only meant to illustrate a highly simplified depiction of the actual process. At this time one now has the epitaxial film separated laterally by oxide regions, but still attached to the N+ substrate. At this point, the nitride mask is removed by a chemical etch technique involving hot phosphoric acid and one proceeds to build the device as any other silicon on sapphire device.

Figure 4D:
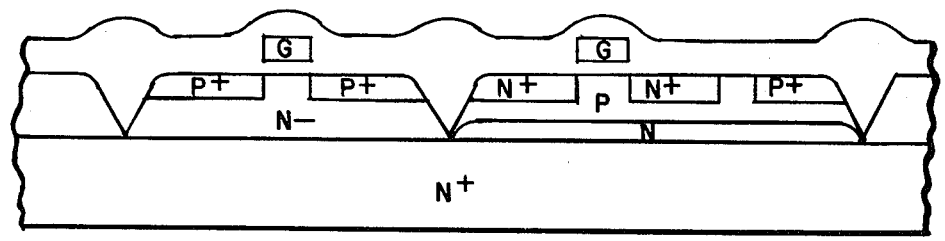
FIG. 4d shows the fourth step in the fabrication of the device according to the present invention including implanting N+ and P+ regions, and depositing a protective glass layer over the device.

Turning next to FIG. 4d, there is shown a cross-sectional view of the structure during the final processing step according to the present invention. At this time the P channel is implanted with phosphorus to adjust its final threshold, and the regions which will be the N channel regions are implanted with boron to form a deep P well. The P well preferably extends approximately two-thirds the depth of the epitaxial film or about 0.6 micron. This implantation is preferably done in a three energy implant to ensure that the doping concentration will be uniform throughout the thickness of the epitaxial film. The typical implant schedule for a three energy implant is typically 180 KEV with a dose of $7 \times 10''$; 80 KEV $7 \times 10''$; and a 40 KEV $7 \times 10''$. This implant produces a carrier concentration uniformly through the upper $\frac{2}{3}$rds of the epitaxial film with a surface concentration of the order of $1 \times 10$ carriers per cubic centimeter.

Once the p-well and isolation oxide is established, the gate oxide is grown in a clean furnace, either in steam or in dry oxygen. The thickness of the gate oxide will be selected depending upon the size of the device and the performance required from the circuit. Typical gate oxide thicknesses will range from 400 to 1000 Angstroms. Immediately after the gate oxide is grown a layer of polysilicon is deposited, usually N+, although it can be polysilicide or P+ or combinations of both, as well.

The gates are defined in the standard photolithographic manner. They are etched either by plasma or wedge etching, depending upon the geometries desired. Following the gate patterning the source and drain implants are placed into position through masking operations. A typical P channel implant involves a double implant at two energies, with a relative high dose. The dose should be such as to render the source and drain regions degenerate in nature. The penetration of the implant should be in the order of $\frac{1}{2}$ micron for both the source and drain regions, as well as the contact to the P well. Once the implants are in position, an implanted anneal may be performed.

The implant anneal is followed by a deposition of a phosphorous silicate glass, typically of the order of 6000–8000 Angstroms in thickness. The glass is reflowed to ensure smooth contouring of the surfaces. Reflow is done by a furnace operation of 1000° C. for 20 minutes.

The phosphorous glass is in the order of 7% phosphorus. At this percentage, the phosphorous glass begins to soften under the described process conditions and begins to flow, thereby rounding off all corners and filling crevices. A subsequent photolithographic step then opens up areas in which the contacts to the source, drain and gate areas are to be made. The contacts are etched through the phosphorous glass layer down to the silicon by means of a hydrofloric acid etch. The photoresist is removed, metal is deposited, followed by a photolithographic process to define the metal and then finally a sintering operation which sinters the metal into the contact areas. The entire structure is then covered by a low temperature vapox glass which ensures against metal scratching during subsequent processing.

While the invention has been illustrated and described as embodied in a method of fabrication of dielectrically isolated CMOS devices, it is not intended to be limited to the details shown, since various modifications and structural changes may be made without departing in any way from the spirit of the present invention.

It will be obvious to those skilled in the art that the semiconductor device according to the present invention can be implemented with various semiconductor technologies and different combinations of known process steps, and that the preferred embodiments illustrated here are merely exemplary. The depth of penetration of the various zones and regions and in particular the configuration and distance between the active zones of the transistor devices, as well as the concentrations of dopant species, and/or their concentration profiles, can be chosen depending upon the desired properties. These and other variations can be further elaborated by those skilled in the art without departing from the scope of the present invention.

The present invention is moreover not restricted to the particular embodiments of a method of fabrication of dielectrically islated CMOS devices described. For example, it may be pointed out that semiconductor materials other than silicon, for example, $A_{III}$-$B_V$ compounds may be used. Furthermore, the conductivity types in the embodiment may be interchanged and corresponding to such change, the polarity of the respective operating voltages adapted. Moreover, the voltage level and the static or dynamic nature of the signals applied to the various terminals and gates of the device, as well as the voltage sources, may be suitably selected as desired for a particular application. Other types of semiconductor circuits including bipolar junction field effect transistor, MNOS (metal electrode-silicon nitride, silicon oxide-semiconductor), MAOS (metal, aluminum oxide, silicon oxide, semiconductor), MAS (metal, aluminum oxide, semiconductor), floating gate FETs, and AMOS FETs (avalanche MOS FETs), may be used as well.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. A method of fabricating an isolation structure between semiconductor devices on a body of semiconductor material of a first conductivity type and a first dopant concentration to retard latch-up effects between devices comprising the steps of:

depositing a layer of semiconductor material of said first conductivity type and a second dopant concentration on said body of semiconductor material;

defining an etchant resistant and oxide inhibiting masking pattern on a major surface of said layer of semiconductor material where distinct silicon islands and corresponding semiconductor devices are to be formed;

etching openings in said layer at regions defined by said pattern, said openings extending through said layer to said body;

depositing dopant species of a second conductivity type in predetermined ones of said silicon islands so that the major surface and exposed edges of said ones of said islands becomes second conductivity type;

thermally oxidizing the exposed surface portions of said body of semiconductor material so that oxide fills said openings and electrically and physically separates the silicon islands;

removing said oxide inhibiting masking pattern;

thermally oxidizing the exposed surface portions of said body of semiconductor material to form a thin oxide layer over the major surface of said silicon islands;

forming a gate element on said thin oxide layer on said silicon islands;

selectively providing a first dopant species of second conductivity type in silicon islands of first conductivity type, and a second dopant species of first conductivity type in silicon islands of second conductivity type, thereby forming source and drain regions of a field effect transistor; and selectively removing portions of said thin oxide layer to form contact areas to said active regions.

2. A method as defined in claim 1, wherein said first conductivity type is N-type and said first dopant concentration is less than said second dopant concentration.

3. A method as defined in claim 1, wherein said oxide inhibiting masking pattern comprises a silicon nitride layer.

4. A method as defined in claim 1, wherein said step of selectively providing first and second dopant species includes providing a first dopant species of second conductivity type in silicon islands of first conductivity type, and providing a second dopant species of first conductivity type in silicon islands of second conductivity type, thereby forming source and drain regions of a MOS field effect transistor.

5. A method as defined in claim 1, wherein said step of selectively providing dopant species utilizes a gate element as a mask.

6. A method of manufacturing insulated gate complementary field effect transistors on a bulk semiconductor substrate comprising providing a silicon semiconductor body portion of a first conductivity and first dopant concentration providing on the surface of said body a layer of semiconductor material of said first conductivity type and a second dopant concentration;

defining an etchant resistant and oxide inhibiting masking pattern on a major surface of said layer of semiconductor material where distinct silicon islands and corresponding MOS field effect transistors are to be formed;

etching openings in said layer at regions defined by said pattern, said openings extending through said semiconductor layer to said body portion;

depositing dopant species of second conductivity type in predetermined ones of said silicon islands so that the major surface and exposed edges of ones of said islands becomes second conductivity type, thereby forming active regions of an MOS field effect transistor of opposite conductivity type to the MOS field effect transistor to be formed in an adjacent island;

dielectrically isolating adjacent semiconductor islands which are to contain MOS field effect transistors of opposite conductivity types in order to retard latch-up between such transistors by thermally oxidizing the exposed surface portions of said body of semiconductor material by causing thereon the growth of a silicon oxide that penetrates into the body portion except where masked by oxidation masking material;

removing said oxide inhibiting masking pattern after said oxidation treatment;

subjecting the exposed surface portions of said body of said semiconductor material to an oxidation treatment to form a insulating layer which is thinner than the penetrated grown oxide over the major surface of said silicon islands;

providing a gate element on the thinner insulating layer;

selectively providing first and second dopant species through said thin insulating layer for forming active regions of MOS field effect transistor devices, complementary field effect transistors being formed in at least some adjacent silicon islands; including providing both first and second dopant species in silicon islands of second conductivity type, the first dopant species forming source and drain regions, and said second dopant species forming a contact region to the silicon island of second conductivity type; and applying source and drain connections to the opposite type surface regions of said silicon islands and contacts to the same type surface regions with higher dopant concentration to form an electrical contact to such silicon islands.

* * * * *